(12) United States Patent
Yoon

(10) Patent No.: US 12,472,532 B2
(45) Date of Patent: Nov. 18, 2025

(54) SUBSTRATE TREATING APPARATUS AND CLEANING NOZZLE USED THEREIN

(71) Applicant: KCTECH CO., LTD., Anseong-si (KR)

(72) Inventor: Geun Sik Yoon, Anseong-si (KR)

(73) Assignee: KCTECH CO., LTD., Anseong-si (KR)

( * ) Notice: Subject to any disclaimer, the term of this patent is extended or adjusted under 35 U.S.C. 154(b) by 361 days.

(21) Appl. No.: 18/112,398

(22) Filed: Feb. 21, 2023

(65) Prior Publication Data

US 2023/0271228 A1 Aug. 31, 2023

(30) Foreign Application Priority Data

Feb. 25, 2022 (KR) .................. 10-2022-0025365
Jan. 31, 2023 (KR) .................. 10-2023-0012742

(51) Int. Cl.
| | |
|---|---|
| *B08B 3/02* | (2006.01) |
| *B08B 1/12* | (2024.01) |
| *B08B 3/10* | (2006.01) |
| *H01L 21/67* | (2006.01) |

(52) U.S. Cl.
CPC ............. *B08B 3/022* (2013.01); *B08B 1/12* (2024.01); *B08B 3/10* (2013.01); *H01L 21/67051* (2013.01)

(58) Field of Classification Search
CPC ........................................ B08B 3/022
See application file for complete search history.

(56) References Cited

U.S. PATENT DOCUMENTS

2004/0261817 A1* 12/2004 Araki ............... H01L 21/67051
134/102.1

* cited by examiner

*Primary Examiner* — Jason Y Ko
(74) *Attorney, Agent, or Firm* — Stein IP LLC

(57) ABSTRACT

Disclosed are a substrate processing apparatus and a cleaning nozzle for substrate processing included therein. More particularly, a substrate processing apparatus, including: a support for holding a disk-shaped substrate; and a cleaning nozzle for spraying a mixed fluid, in which liquid and gas are mixed, to a surface of the substrate in a slit shape through a slit-shaped discharge port to remove foreign substances remaining on the substrate with the mixed fluid discharged from the discharge port is provided. Accordingly, a substrate processing apparatus capable of improving the mixing uniformity of gas and liquid in a slit-shaped discharge fluid; and a cleaning nozzle for substrate processing used therefor are provided.

19 Claims, 14 Drawing Sheets

SUBSTRATE TREATING APPARATUS AND CLEANING NOZZLE USED THEREIN

CROSS-REFERENCE TO RELATED APPLICATION

This application claims priority to and the benefit of Korean Patent Application Nos. 10-2022-0025365 filed on Feb. 25, 2022 and 10-2023-0012742 filed on Jan. 31, 2023 the disclosure of which is incorporated herein by reference in its entirety.

BACKGROUND OF THE INVENTION

1. Field of the Invention

The present disclosure relates to a substrate processing apparatus and a cleaning nozzle included therein, and more particularly to a substrate processing apparatus capable of improving the mixing uniformity of gas and liquid and more efficiently cleaning a substrate; and a cleaning nozzle included in the substrate processing apparatus.

2. Description of the Related Art

During the process of fabricating a semiconductor device using a substrate, an apparatus for cleaning and removing particles, organic contaminants, metal impurities and the like adhering to the surface of the substrate is used. Also in a process of manufacturing a display device, it is necessary to coat a liquid display device on a clean thin glass substrate from which foreign substances adhered to the surface thereof have been removed.

As such, processes of processing substrates (hereinafter, "substrate," "glass substrate," and the like are referred to as "substrate") such as a substrate used to manufacture a semiconductor device or a glass substrate used to manufacture a display device necessarily accompany a substrate cleaning process.

A substrate cleaning process is performed in various forms, but, as one example, a method of spraying a mixture of cleaning liquid and high-pressure gas on the surface of a substrate using a fluid nozzle is known.

FIG. 1A is a diagram illustrating an existing substrate processing apparatus 9 for substrate cleaning, and FIG. 1B is a plan view illustrating the path in which a mixed fluid is applied to the surface of a substrate by a nozzle of the substrate processing apparatus of FIG. 1A.

In a substrate processing apparatus 1 illustrated in FIG. 1, a substrate W is mounted on a substrate holder 10 inside a casing 55 so as to be supported or sandwiched by a guard pin 18, and a cleaning liquid or rinsing liquid from a nozzle 20 is sprayed on the surface of the substrate W while rotating (10r) the substrate holder 10 with a rotation shaft 12 as a driving motor. Here, the nozzle 20 may be configured to spray a cleaning liquid at high pressure, but may be configured to discharge a mixed fluid, in which a high-pressure gas (AIR) and a cleaning liquid are mixed, so as to increase the cleaning efficiency.

Here, the nozzle 20 sprays a mixed fluid 93 while reciprocating (20d) in a radial direction with respect to the substrate W, so that the mixed fluid 93 is applied to the entire surface of the rotating (10r) substrate W to clean the substrate W.

However, as the nozzle 20 used in the existing substrate processing apparatus 1 sprays a mixed fluid in a circular spray form, there is a large cleaning deviation according to the spray position, and there is a problem that a shadow is generated in a hit region 10s of the substrate 10.

Therefore, there is an urgent need for a method that can easily control the spray position of a cleaning nozzle, prevent shadowing at a position where a mixed fluid hits, and increase the cleaning efficiency of the substrate.

SUMMARY OF THE INVENTION

Therefore, the present disclosure has been made in view of the above problems, and it is an object of the present disclosure to increase the cleaning efficiency by preventing shadows from occurring at the position of a substrate struck by a mixed fluid sprayed from a cleaning nozzle.

It is another object of the present disclosure to reduce the cleaning time and improve the cleaning efficiency by spraying a mixed fluid sprayed from the cleaning nozzle in a slit shape to sweep foreign substances remaining on the substrate in a sweep method.

It is still another object of the present disclosure to increase the cleaning efficiency by homogeneously mixing the gas and liquid in a mixed fluid to be discharged in a slit shape.

It is yet another object of the present disclosure to minimize the flow of liquid to be mixed with gas along an inner wall of the cleaning nozzle and to enable it to be distributed in the gas.

In accordance with an aspect of the present disclosure, the above and other objects can be accomplished by the provision of a substrate processing apparatus, including: a support for holding a disk-shaped substrate; and a cleaning nozzle for spraying a mixed fluid, in which liquid and gas are mixed, to a surface of the substrate in a slit shape through a slit-shaped discharge port to remove foreign substances remaining on the substrate with the mixed fluid discharged from the discharge port.

In accordance with another aspect of the present disclosure, there is provided a cleaning nozzle for spraying a fluid to clean a substrate, the cleaning nozzle including: a first body including a gas inflow passage where the gas is supplied and passes; and liquid inflow passages where the liquid is supplied and passes; and a second body including a gas passage configured to communicate with the gas inflow passage and provided with a slit-shaped through hole formed to pass therethrough in a straight line shape; and liquid passages configured to communicate with the liquid inflow passage and extended to meet the gas passage, wherein a slit-shape hole is formed at a position extending downward from a position where the gas passage and the liquid passages meet, and wherein the second body is coupled to the first body.

The expression "support" described in the present specification and the accompanying claims is defined to include all configurations for maintaining a substrate at a certain position, such as keeping in contact with the edge of the substrate or holding a part or all of the lower surface of the substrate.

The expression "upward and downward" and similar terms described in the present specification and the accompanying claims are defined as referring to a direction extending along a discharge direction (z-axis direction in diagrams) for spraying of a cleaning nozzle.

The expression "width direction" and similar terms described in the present specification and the accompanying claims are defined as referring to a wide longitudinal direction (x-axis direction in diagrams) of a slit shape in which a mixed fluid is discharged.

The expression "thickness direction" and similar terms described in the present specification and the accompanying claims are defined as referring to a short length direction (y-axis direction in diagrams) of a slit shape in which a mixed fluid is discharged.

The expression "long side" described in the present specification and the accompanying claims refers to the long side (length in the x-axis direction in diagrams) of a striking surface that is formed of a slit-shaped mixed fluid and strikes a substrate, and the expression "short side" described in the present specification and the accompanying claims refers to the short side (length in the y-axis direction in diagrams) of a striking surface that is formed of a slit-shaped mixed fluid and strikes a substrate.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE INVENTION

Figure 1A:
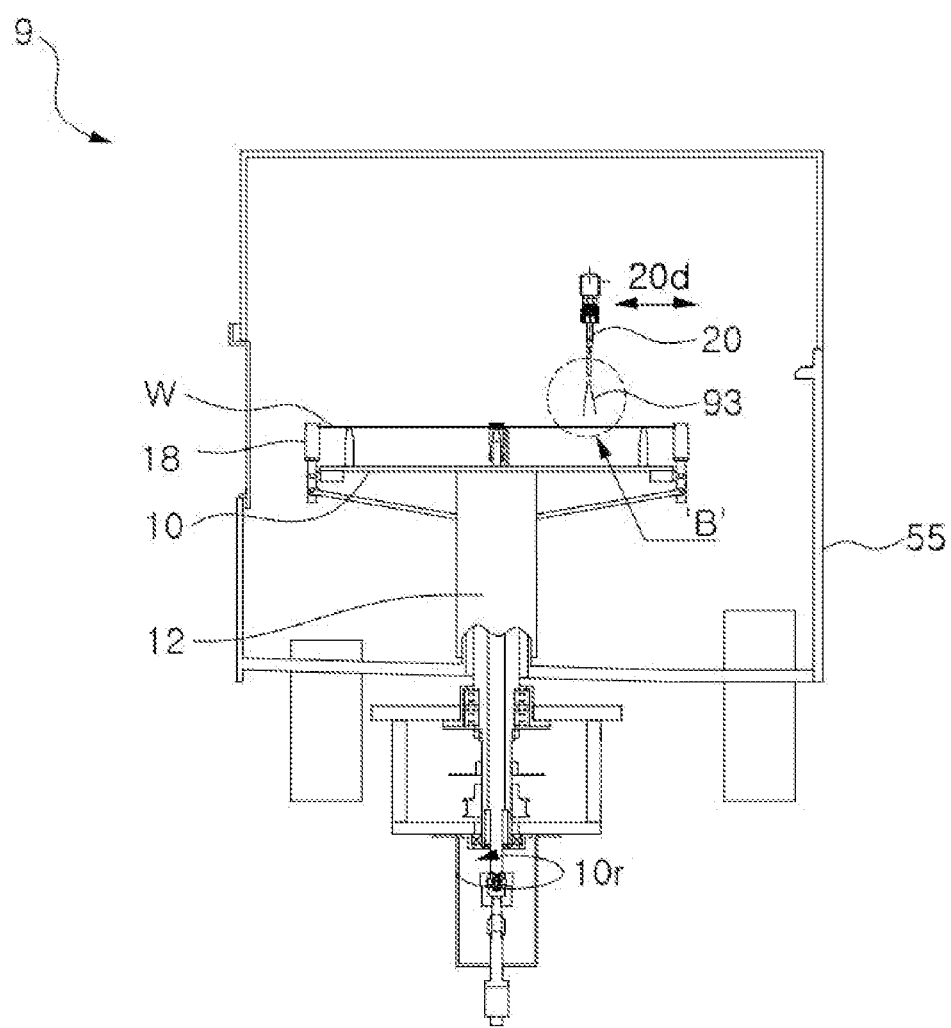
FIG. 1A is a diagram illustrating the composition of an existing substrate processing apparatus.
Figure 1B:
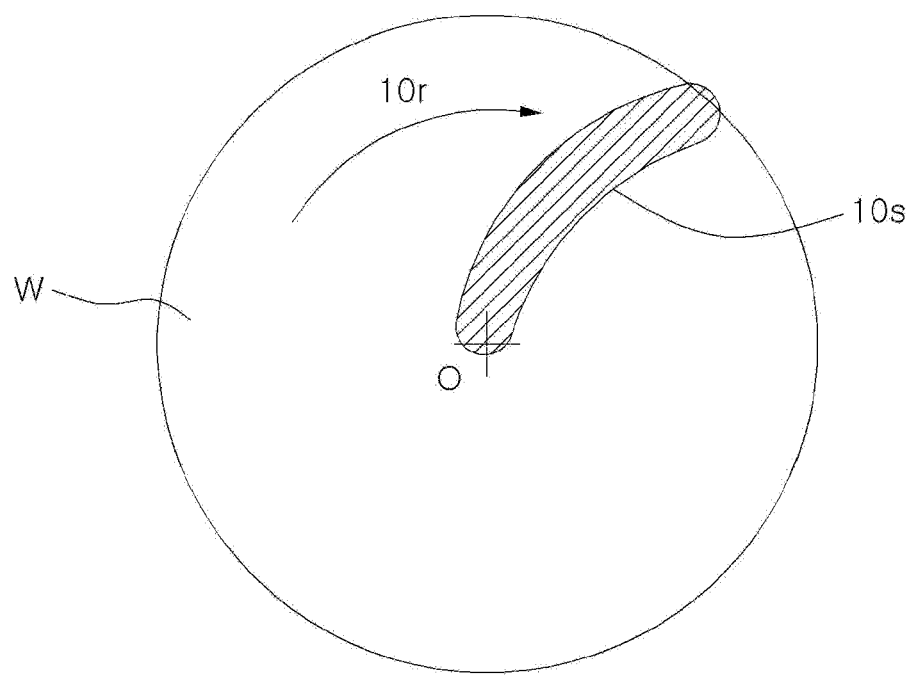
FIG. 1B a plan view illustrating a path in which a mixed fluid is applied to a substrate surface by a nozzle of the substrate processing apparatus of FIG. 1.
Figure 2:
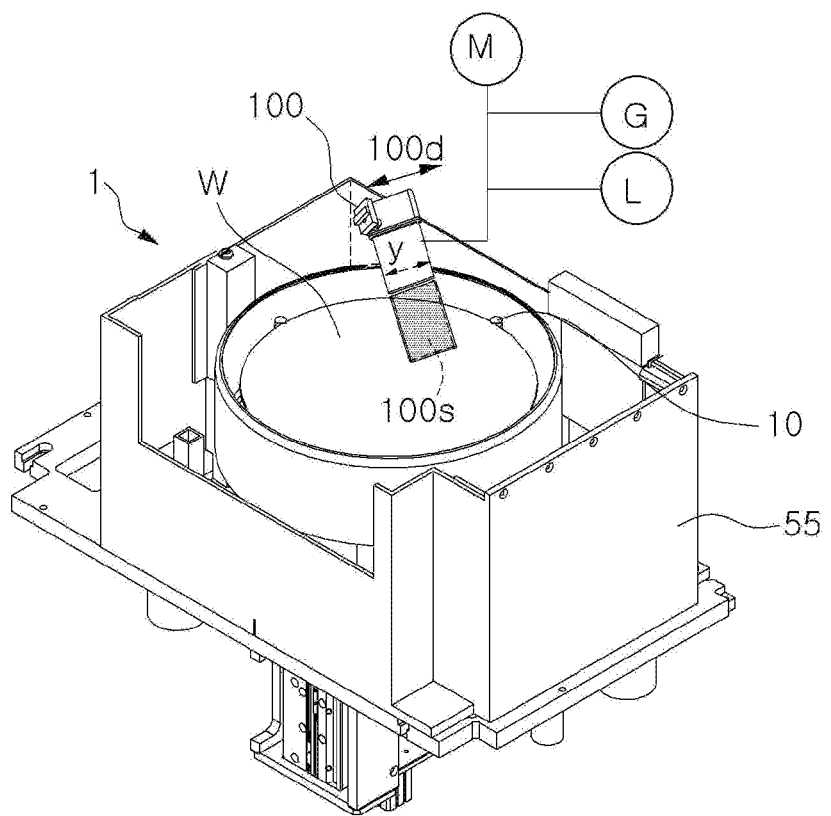
FIG. 2 is a perspective view illustrating the composition of a substrate processing apparatus according to an embodiment of the present disclosure.

Hereinafter, preferred embodiments of the present disclosure are described in detail with reference to the accompanying drawings, but the present disclosure is not limited to the embodiments. For reference, in this description, the same numbers refer to substantially the same elements, and, under these rules, descriptions may be made by citing contents described in other drawings. In addition, contents determined to be obvious to those of skill in the art or repeated contents may be omitted.

As shown in the accompanying drawings, the substrate processing apparatus according to the present disclosure includes a support 10 that maintains a disc-shaped substrate W in a fixed position and rotates (10r) with the disc-shaped substrate 10 as needed; a cleaning nozzle 100 configured to spray a mixed fluid toward the surface of the substrate W; a nozzle controller M configured to adjust the position and angle of the cleaning nozzle 100; a gas supplier G configured to supply gas to the cleaning nozzle 100; and a liquid supplier L configured to supply a liquid to the cleaning nozzle 100.

A fluid discharged from the cleaning nozzle 100 is a mixed fluid 100a in which gas and liquid are mixed. As the discharge port 101 of the cleaning nozzle 100 is formed in a slit shape, a striking surface 100s formed of a mixed fluid 100a which is discharged from the discharge port 101 and strikes the surface of the substrate W forms a slit shape wherein a long side Ls of the striking surface 100s is several to several tens of times larger than a short side Li thereof. Here, although the drawings illustrate a configuration wherein the long side Ls and short side Li of the striking surface 100s are formed in a straight line shape, one or more of the long side Ls and short side Li of the striking surface 100s may be formed in a curved shape according to another embodiment of the present disclosure. That is, the mixed fluid discharged from the cleaning nozzle according to the present disclosure is sprayed in a slit shape consisting of a straight line or a curve and is directly sprayed onto the substrate in a slit shape.

The support 10 is configured to maintain the substrate W, which is cleaned by a fluid sprayed from the cleaning nozzle 100, in a predetermined position.

Figure 3A:
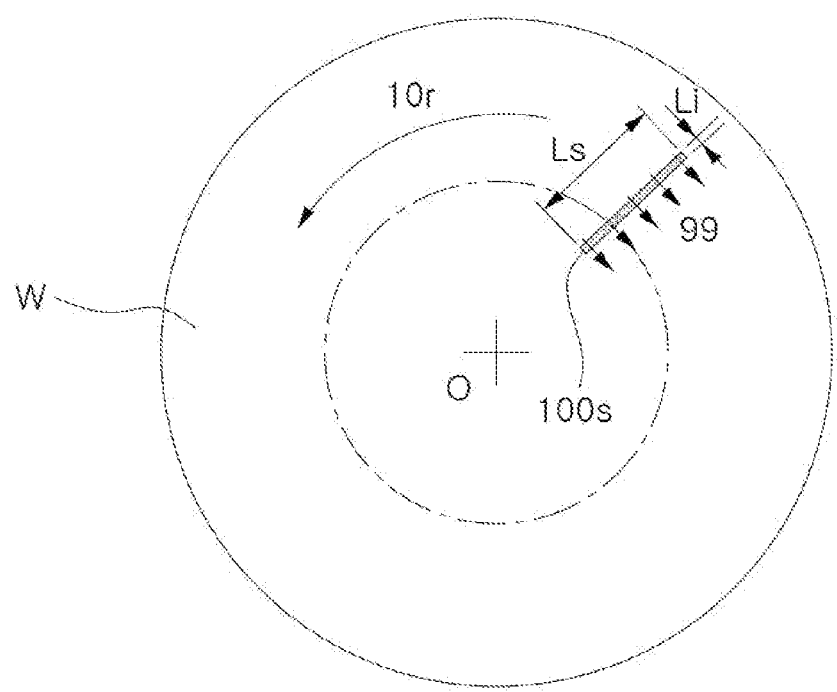
FIG. 3A is a plan view illustrating a striking position and moving direction of a mixed fluid sprayed onto a substrate by the substrate processing apparatus of FIG. 2.
Figure 3B:
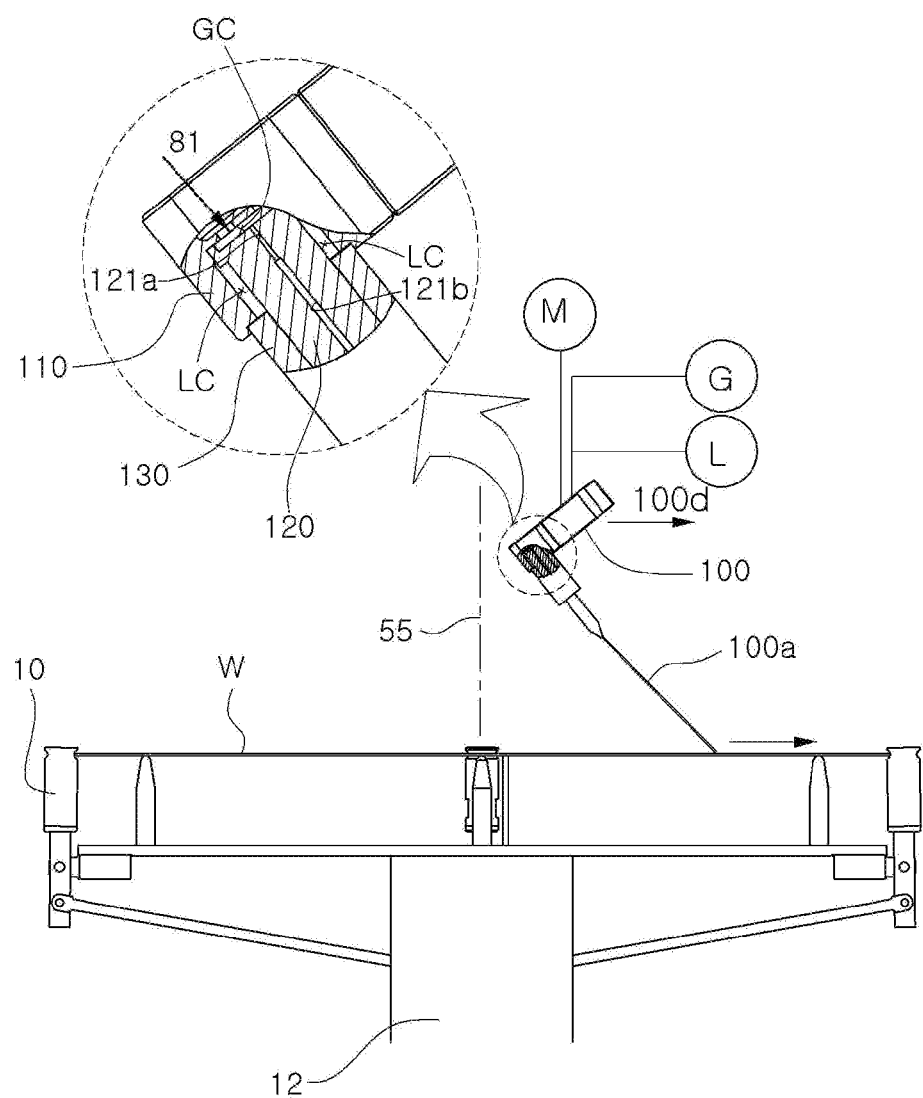
FIG. 3B illustrates a side view of the substrate processing apparatus of FIG. 2.

For example, the support 10 may be formed of a plurality of guard pins supporting the edge of the substrate W or may be configured in a form wherein at least a part of a lower surface of the substrate is supported on a mounting surface of the support 10 (not shown), as shown in FIG. 3B. That is, the shape and support structure of the support 10 may be variously changed according to required conditions and design specifications, and the present disclosure is not limited by the type and structure of the support 10.

The support 10 is rotatably provided around the rotation shaft 12 and assists in widening a contact area with the substrate by rotating the substrate while cleaning the substrate through a fluid sprayed from the cleaning nozzle 100.

The nozzle controller M is configured to adjust the position and angle of the cleaning nozzle 100, thereby controlling the spray angle and spray position of a mixed fluid sprayed from the cleaning nozzle 100. For example, the cleaning nozzle 100 is rotatably mounted at the end of a swiveling arm, so that the spray angle of a mixed fluid may be controlled by the rotation angle of the arm and the position of the arm may be controlled by the swiveling of the arm.

According to another embodiment of the present disclosure, the position and angle of the cleaning nozzle 100 may be adjusted by other various methods, and the position of the cleaning nozzle 100 may be configured to move in a straight line or in various paths combined with a straight line and a curve in addition to a curved shape by the arm.

As shown in FIG. 3A, a spray controller M is formed to control the discharge pressure of the mixed fluid 100a discharged from the cleaning nozzle 100.

As needed, the spray controller M may adjust the discharge angle of the mixed fluid 100a and may be configured to keep the discharge angle of the mixed fluid 100a constant. The spray controller M may move the striking surface 100s, which strikes the substrate W, formed of the mixed fluid 100a discharged from the discharge port in a radial or circumferential direction by moving the cleaning nozzle 100 or adjusting the angle of the cleaning nozzle 100.

The gas supplier G supplies gas for generating the mixed fluid 100a discharged from the cleaning nozzle 100. The gas may be selected from various gases that can be used in the cleaning process of the substrate and, for example, may be air, nitrogen gas, ammonia gas, or the like.

The liquid supplier L supplies liquid to generate the mixed fluid 100a discharged from the cleaning nozzle 100. The liquid may be selected from various liquids that can be used in the cleaning process of the substrate and, for example, may be pure water (DIVV), chemical, or the like.

Figure 4:
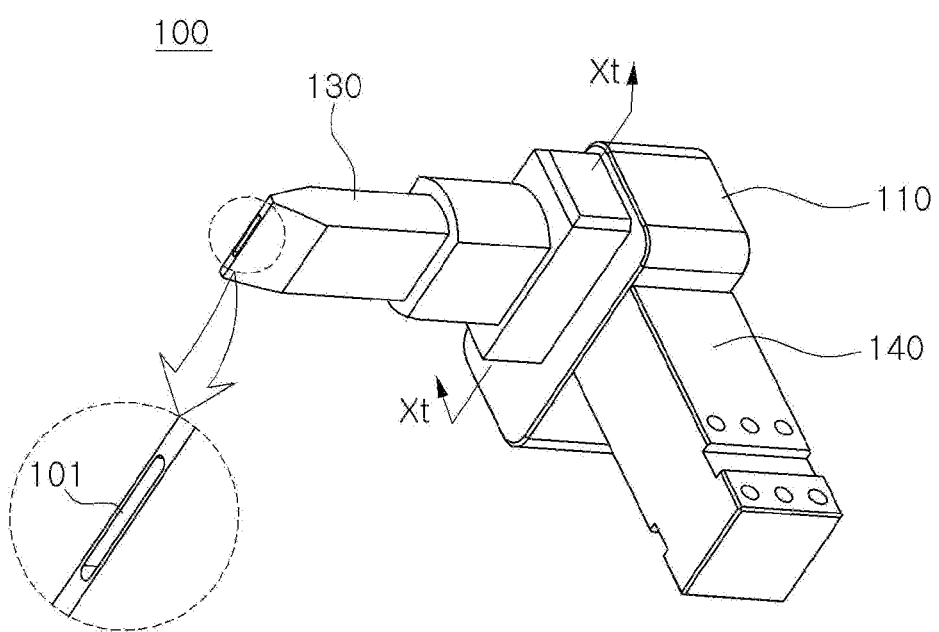
FIG. 4 illustrates a perspective view of a cleaning nozzle of FIG. 2.
Figure 5:
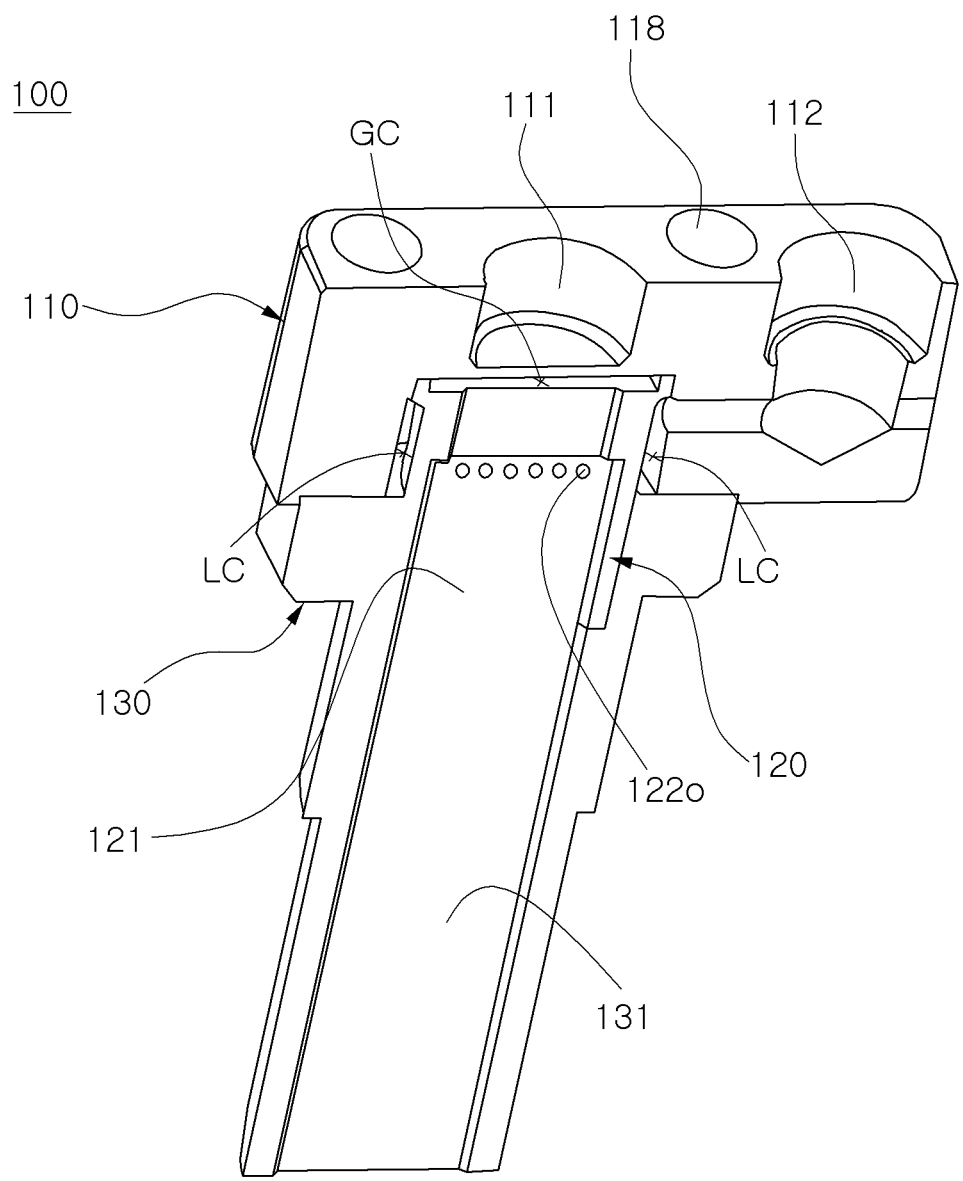
FIG. 5 illustrates a longitudinal sectional view taken along line Xt-Xt of the cleaning nozzle of FIG. 4.

As shown in FIGS. 4 and 5, the cleaning nozzle 100 includes a first body 110 connected to the gas supplier G and the liquid supplier L; a second body 120 configured to mix a supplied liquid and gas with a fluid mixture mixed in a homogeneous state while forming a slit shape; a third body 130 configured to extend a mixed flow longer to obtain straightness of the mixed fluid 100a discharged from the discharge port 101; and a connecting member 140 connected to the first body 110 to fix the cleaning nozzle 100 to the arm, etc. of the nozzle controller M.

Figure 6:
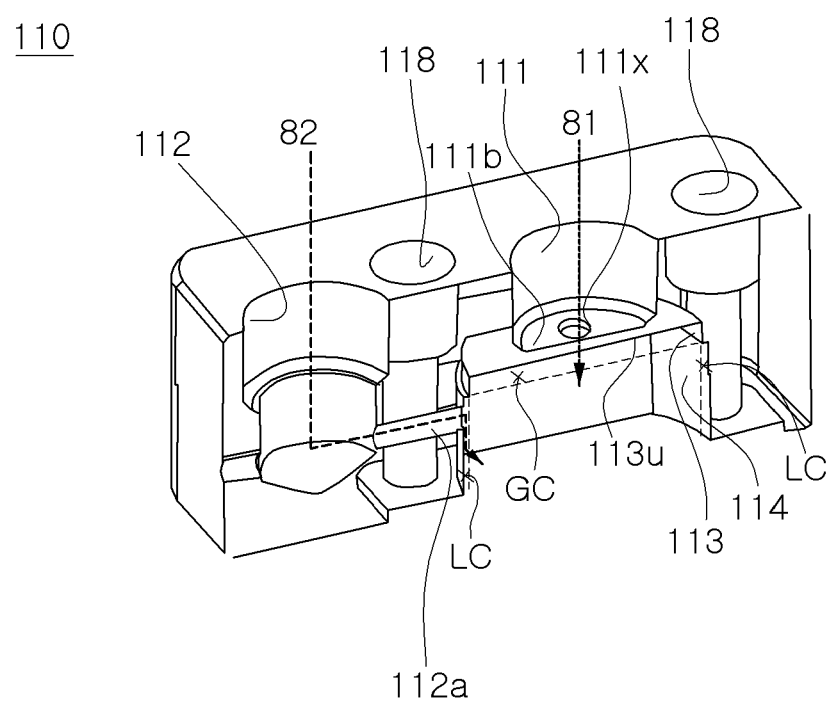
FIG. 6 illustrates a longitudinal sectional view of a first body of FIG. 5.

As shown in FIGS. 5 and 6, a gas inflow passage 111 to which a gas pipe connected to the gas supplier G is coupled such that gas supplied to a nozzle passes therethrough; and a liquid inflow passage 112 to which a liquid pipe connected to the liquid supplier L is coupled such that a liquid supplied to a nozzle formed to pass through a bent shape 112a passes therethrough are formed in the first body 110.

The gas inflow passage 111 is formed to penetrate downward from the upper surface of the first body 110, and the liquid inflow passage 112 is formed to penetrate downward from the upper surface of the first body 110 and then to be bent inward in the radius.

A gas chamber GC is formed in a thin disc shape to supply gas at a more uniform pressure at a lower end of the gas inflow passage 111, and a liquid chamber LC is formed in an annular shape to supply liquid at a more uniform pressure at a lower end of the liquid inflow passage 112.

A small through hole 111x is formed to pass through a bulkhead 111b that forms the gas chamber GC, thereby forming a part of the gas inflow passage 111. The gas chamber GC is formed of a space surrounded by the bulkhead 111b formed in the gas inflow passage 111, a circumferential surface 113 of a lower side of the bulkhead, and an upper surface 126 of a second body 120 to be described below.

In addition, a receiving surface 114 forming an accommodating space that accommodates an upper end of the second body 120 is provided on the lower side of the circumferential surface 113.

The second body 120 includes a slit-shaped gas passage 121 penetrating in a straight line downward from the upper surface 126 forming a bottom surface of the gas chamber GC; and liquid passages 122 formed to penetrate in a straight line that slopes downward from the liquid chamber LC to meet the gas passage 121 at a predetermined angle (ang).

More specifically, a receiving part 126 protruding outward from an upper end of the second body 120 adheres closely to the receiving surface 114 of the first body 110 and is fitted thereinto in an airtight manner. As needed, a sealing ring formed of a material allowing elastic deformation may be interposed between the receiving surface 114 and the receiving part 126.

Meanwhile, referring to FIG. 5, fixing bolts (not shown) penetrating bolt holes 118 of the first body 110 are coupled with fastening grooves 138 formed on an upper surface of the third body 130 in a state in which the third body 130 is in close contact with a bottom surface of the first body 110, thereby being assembled to first body 110. In addition, the second body 120 settles in a space between the first body 110 and the third body 130.

Here, the annular liquid chamber LC surrounding an upper end of the second body 120 is formed between an end of the liquid inflow passage 112 of the first body 110 and the outer circumferential surface of the second body 120 toward which the end faces, and a liquid supplied through the liquid inflow passage 112 fills the liquid chamber LC. An inlet 122i of the liquid passage 122 of the second body 120 is positioned in the liquid chamber LC, and the liquid filling the liquid chamber LC flows into the liquid passages 122 of the second body 120, so the amount of liquid flowing into the liquid passages 122 per unit time is constantly controlled according to the supply pressure of the liquid supplier L.

Similarly, the gas chamber GC having a thin plate shape formed on an upper end of the second body 120 is formed between an end of the gas inflow passage 111 of the first body 110 and the upper surface 126 of the second body 120 to which the end faces, and gas supplied through the gas inflow passage 111 fills the gas chamber GC at a constant pressure. An inlet 121i of a gas passage 121 of the second body 120 is positioned in the gas chamber GC, and the gas filling the gas chamber GC at a certain pressure flows into the gas passage 121 of the second body 120, so the amount of gas flowing into the gas passage 121 per unit time is constantly adjusted according to the supply pressure of the gas supplier G.

As such, since the amount of gas and liquid introduced into the gas passage 121 and the liquid passages 122 is uniformly maintained at each set pressure before gas and liquid flow into the gas passage 121 and the liquid passages 122 of the second body 120 as the gas chamber GC and the liquid chamber LC are formed, the effect of precisely controlling a mixing ratio of liquid and gas can be obtained.

Moreover, as the liquid chamber LC is formed in an annular shape surrounding the second body 120, a constant amount of liquid per unit time can be introduced into the liquid passages 122 due to the formation of a large volume as a whole even if a gap between the first body 110 and the second body 120 is formed small, so the advantage of obtaining operational reliability with a compact structure is obtained.

Figure 7A:
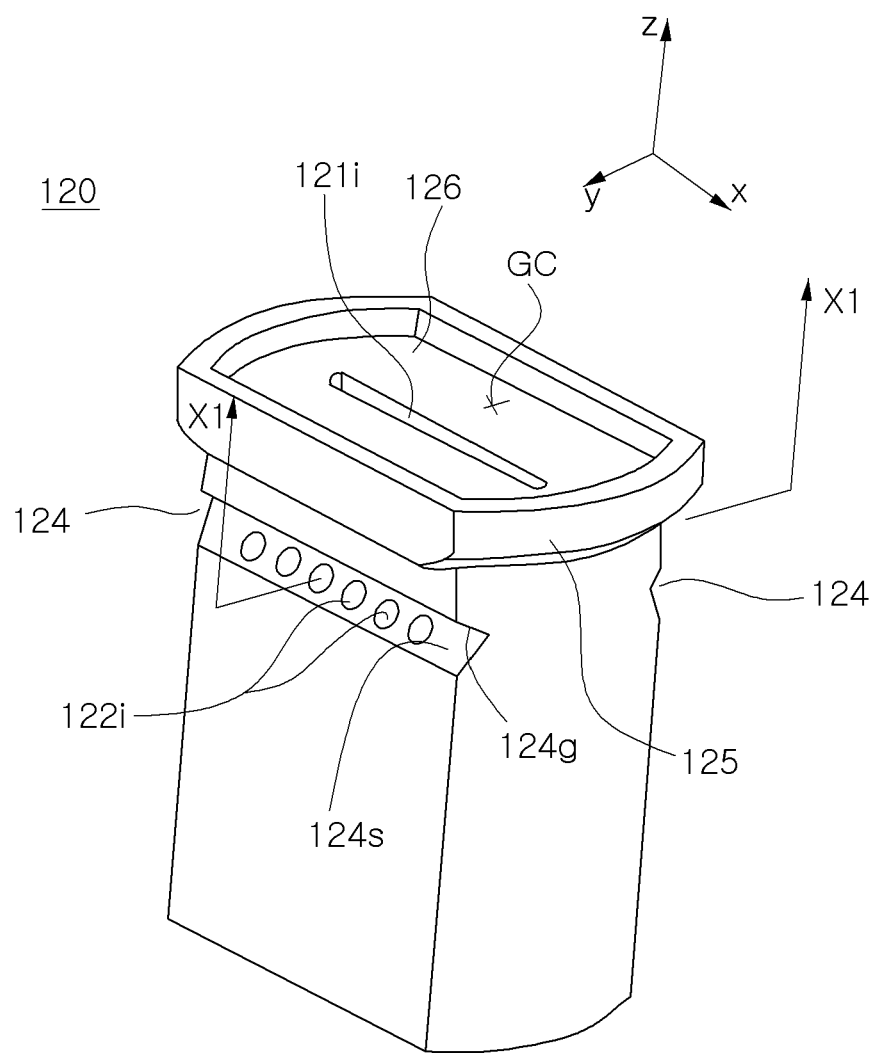
FIGS. 7A and 7B are perspective views illustrating the composition of a second body of FIG. 5.
Figure 7B:
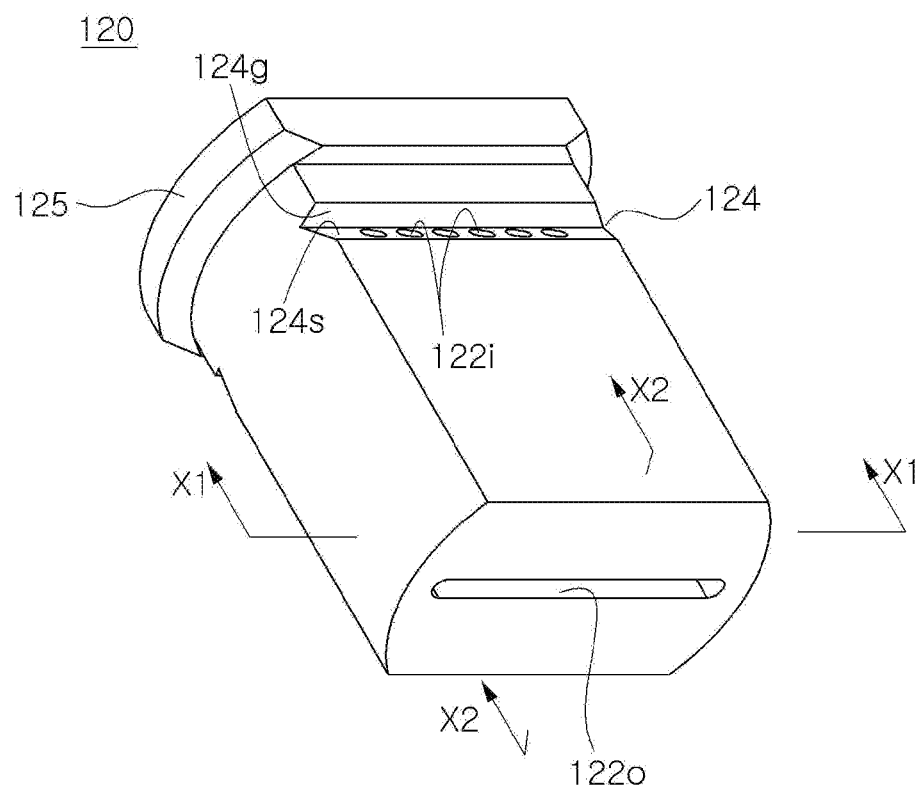
Figure 7C:
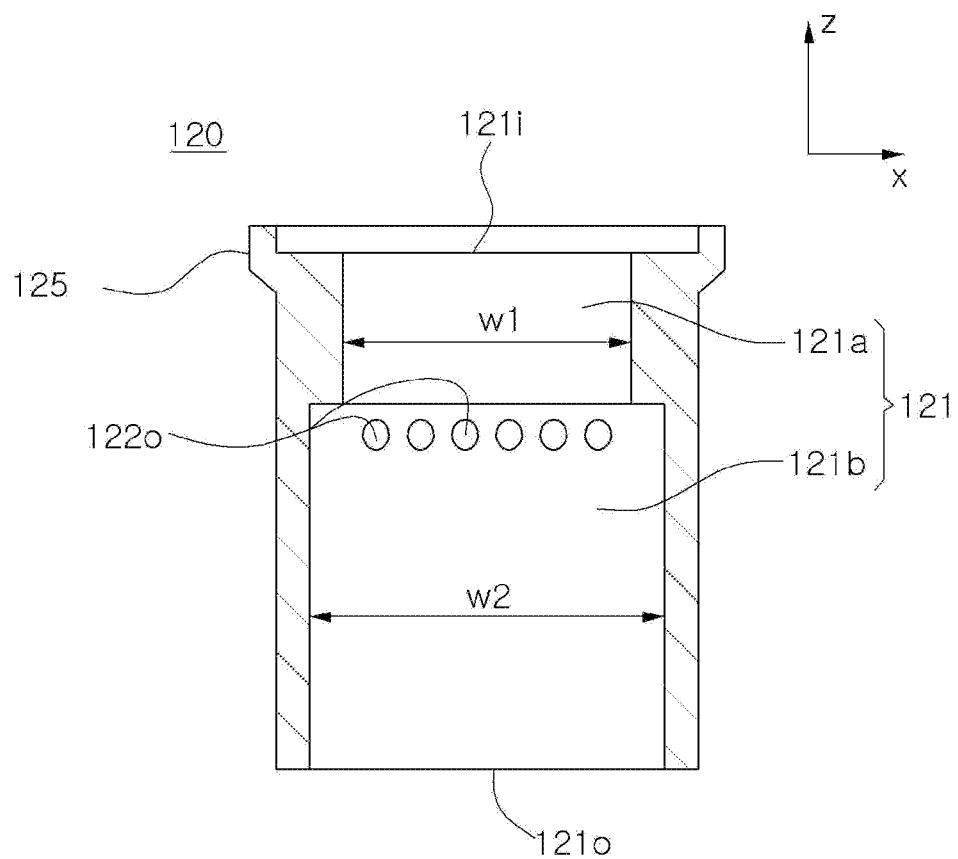
FIG. 7C illustrates a longitudinal sectional view taken along line X1-X1 of the second body of FIG. 7B.
Figure 7D:
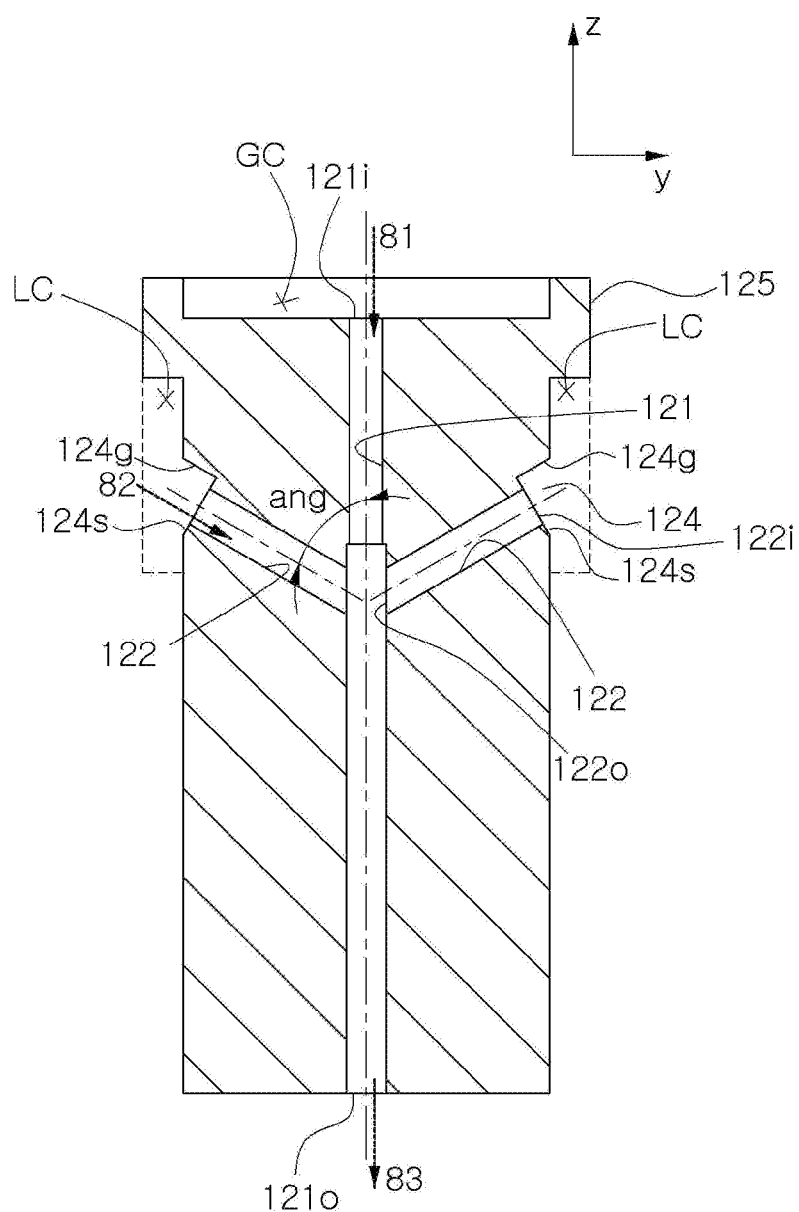
FIG. 7D illustrates a longitudinal sectional view taken along line X2-X2 of the second body of FIG. 7B.
Figure 8:
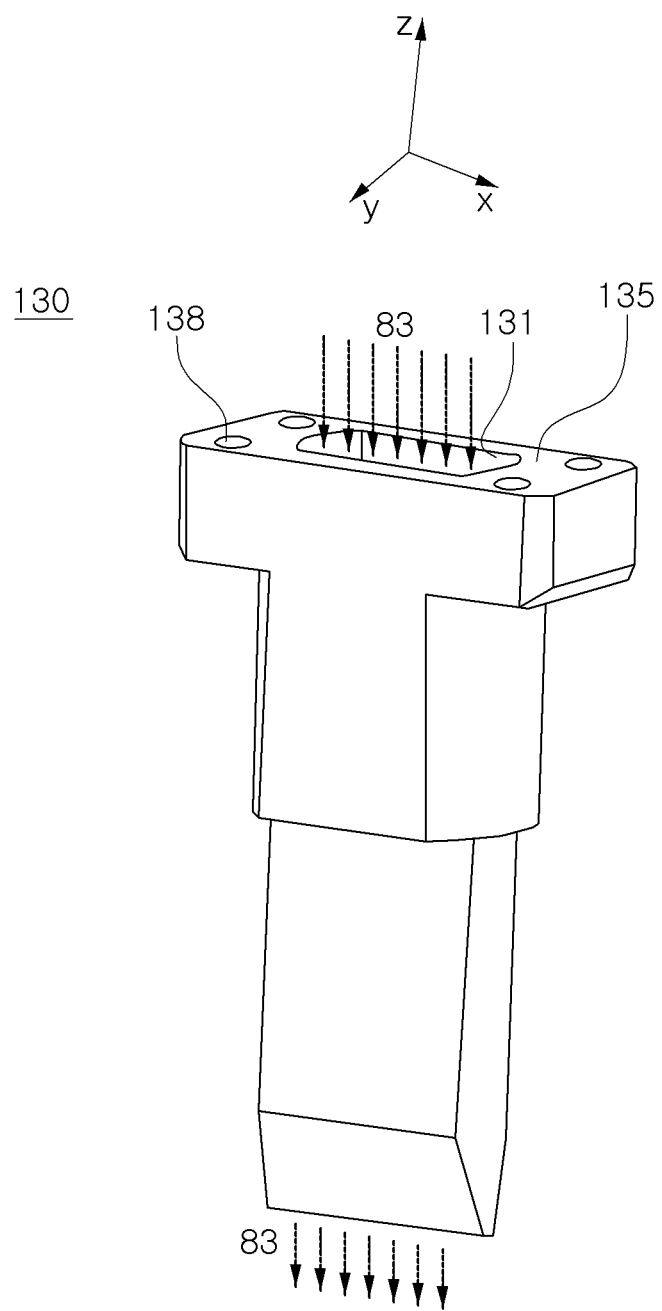
FIG. 8 is a perspective view illustrating the composition of a third body of FIG. 5.

Meanwhile, as shown in FIGS. 7A, 7B, and 7D, a support surface 124s perpendicular to the extension direction of the liquid passage 122 is formed on an outer surface of the second body 120. Thereby, when the liquid filling the liquid chamber LC enters the liquid passages 122, it is directly induced into a flow parallel to the extension direction of the liquid passage 122, thereby minimizing the generation of vortices inside the liquid passages 122.

Here, although the support surface 124s may be formed in a protruding form on the outer surface of the second body 120, the support surface 124s may be provided on a concave portion 124 that is sharply concave from the outer surface of the second body 120 so that liquid flows into the liquid passages 122 sequentially in the order of liquid flowing into the concave portion 124. Accordingly, vortices in the annular liquid chamber LC can be minimized, thereby preventing a variation in a liquid supply amount.

In addition, the concave portion 124 may be formed in a triangular cross-section by the support surface 124s and a guide surface 124g erected vertically with respect to the support surface 124s. Here, the guide surface 124g is formed perpendicular to the support surface 124s so that it can enter the inlet 122*i* of the liquid passage 122 formed on the support surface 124*s* in a similar shape to a possible laminar flow shape.

Meanwhile, liquid passages 122 extend downward while forming a contained angle (ang) of 45 degrees to 70 degrees with respect to the gas passage 121. When a contained angle (ang) with respect to the gas passage 121 is less than 45 degrees, there is a concern that a part of the liquid flowing into the liquid passage 122 overflows and returns to the inlet 122*i*, and when a contained angle (ang) with respect to the gas passage 121 is greater than 70 degrees, the liquid introduced through the liquid passage 122 and the gas flowing through the gas passage 122 are not smoothly mixed. For example, a contained angle (ang) of each of the liquid passages 122 with respect to the gas passage 121 is preferably formed between 55 degrees and 65 degrees.

According to another embodiment of the present disclosure, the liquid passages 122 may be configured to extend downward from any one outer surface of the second body 120 toward the gas passage 121, but according to a preferred embodiment of the present disclosure, the liquid passages 122 extends downward from two opposite outer surfaces of the second body 120 toward the gas passage 121 so that the outlets 122*o* of the liquid passages 122 face each other and the liquid passages are configured to be symmetrical to each other with respect to the gas passage 121, as shown in FIG. 7D.

Thereby, liquid is introduced to both sides of the y-axis direction of the gas passage 121 through which gas flows so that the liquid may be more smoothly mixed with the gas. In addition, as the outlets 122*o* of the liquid passages 122 face each other, the inertial forces in opposite inflow directions of the liquid toward the gas passage 121 cancel each other, so that the effect of increasing the mixing efficiency while reducing the generation of vortices in the process in which the gas and the liquid meet and are mixed may be obtained.

First of all, the liquid passage 122 forms a plurality of rows separated from each other along a width direction (x-axis direction). That is, the liquid passage 122 may be formed into one, but as they are separated from each other along the width direction (x-axis direction) as shown in FIGS. 7A and 7B, liquid introduced into each of the liquid passages 122 flows independently without mixing with each other and is mixed with gas flowing through the gas passage 121. Thereby, in the mixed fluid 100*a* discharged through the slit-shaped discharge port 101, a mixing ratio of liquid and gas in a part close to a wall in the width direction and a mixing ratio of liquid and gas in a central part in the width direction are constant, so the advantageous effect of being able to create a homogeneous slit-shaped can be obtained.

Meanwhile, based on the outlets 122*o* of the liquid passage 122, the gas passage 121 includes an upper gas passage 121*a* disposed on an upper side compared to the outlets 122*o* and a lower gas passage 121*b* including the outlets 122*o* of the liquid passage 122.

Here, both the upper gas passage 121*a* and the lower gas passage 121*b* extend upward and downward in a constant cross-section shape. However, a first width w1 of the upper gas passage 121*a* is formed smaller than a second width w2 of the lower gas passage 121*b*. Here, a difference between the second width w2 and the first width w1 is determined considering the volume of liquid flowing through the liquid passage 12.

Accordingly, only gas flows in the upper gas passage 121*a*, a liquid 82 introduced from the liquid passages 122 is mixed with a gas flow 81 in the lower gas passage 121*b*, and the lower gas passage 121*b* is formed to have a longer width w2 to accommodate additionally as much as the volume of the liquid introduced into the lower gas passage 121*b*. A mixed fluid 83 discharged through a lower outlet 1210 of the lower gas passage 121*b* flows into the third body 130.

The third body 130 is fastened to fastening holes 138 in a state in which the front end surface 135 is in close contact with a bottom surface of the first body 110, thereby being integrally coupled with the first body 110 with the second body 120 interposed therebetween. Accordingly, the front end surface of the third body 130 forms a bottom surface of the liquid chamber LC.

A mixing passage 131 having the same size and shape as the lower gas passage 121*b* of the second body 120 is formed in the third body 130. Accordingly, flow 83 of the mixed fluid mixed in the second body assists the mixed fluid 100*a* discharged through the discharge port to be sprayed in a straighter line form while passing through the mixing passage 131 of the third body 130 without any resistance. For this, it is preferable that the length of the mixing passage 131 is longer than that of the gas passage 121 of the second body 120.

According to another embodiment of the present disclosure, the liquid chamber LC may be formed only in the shape of a first body or may be formed using other members. Under this configuration, the third body 130 may be omitted.

A substrate processing apparatus 1 according to an embodiment of the present disclosure configured as described above may be used in various ways for cleaning a substrate.

According to an embodiment of the present disclosure, the substrate W mounted on the support 10 may be a substrate before being subjected to a polishing process. In general, a polishing thickness in a polishing process must be polished with precision in the order of tens of nm. If there is a foreign substance on the rear surface of the substrate, the foreign substance tilts the substrate during the polishing process, causing errors in adjusting the polishing thickness of the substrate.

Accordingly, foreign substances remaining on the back of a substrate may be removed by placing the substrate on a mounting part 10 of the substrate processing apparatus 1 configured as described above and spraying the mixed fluid 100*a*, in which liquid and gas are mixed is applied, to the surface of the substrate with high pressure in a slit shape through the slit-shaped discharge port 101 before performing the polishing process, whereby an advantageous effect of increasing the polishing precision of the substrate can be obtained.

Meanwhile, according to another embodiment of the present disclosure, the substrate W mounted on the support 10 may be a substrate that has just undergone a polishing process. Generally, in the polishing process, sludge, such as polishing particles or slurry, adheres to the polishing surface of the substrate. Immediately after the polishing process, the surface of the substrate is in a state before the sludge completely adheres thereto.

It is possible to completely remove the adhered sludge only when it is cleaned by contact cleaning with a brush. However, as a preliminary cleaning process prior to a brush cleaning process corresponding to a main cleaning process, the substrate W, which has just undergone the polishing process, is placed on the mounting part 10 of the substrate processing apparatus 1 configured as described above, and the mixed fluid 100*a*, in which liquid and gas are mixed, is sprayed in a slit shape through the slit-shaped discharge port 101 on the surface of the substrate to separate the sludge from the surface of the substrate, whereby defects caused by the sludge adhering to the substrate can be reduced.

In addition, according to another embodiment of the present disclosure, the substrate processing apparatus 1 configured as described above may be applied to various cleaning processes after the polishing process is performed.

Specifically, the mixed fluid 100a in which liquid and gas are mixed is sprayed to the surface of the substrate in a slit shape through the slit-shaped discharge port 101 using the cleaning nozzle 100 according to the present disclosure before the polishing process, in the preliminary cleaning process, or in the main cleaning process, so that foreign substances remaining on the substrate can be removed by the mixed fluid 100a discharged from the discharge port 101.

For this, according to the present disclosure shown in FIG. 3A, the support 10 rotates (10r) the disk-shaped substrate W, and a long side Ls of the striking surface 100s having a slit shape where the mixed fluid 100a sprayed from the cleaning nozzle 100 strikes the substrate is arranged in the radial direction of the substrate W. Here, according to an embodiment of the present disclosure, the cleaning process may be performed while moving the striking surface 100s in the circumferential direction by the nozzle controller M, but according to a preferred embodiment of the present disclosure, the posture and position of the cleaning nozzle 100 may be adjusted by the nozzle controller M such that the striking surface 100s does not move and is fixed in position.

That is, it is simple to control the cleaning nozzle 100 is simple because the cleaning process of the substrate W is performed while the mixed fluid 100a discharged from the cleaning nozzle 100 strikes the substrate W using the linear speed at which the substrate W rotates (10r) at high speed, and a cleaning time required to remove foreign substances from the substrate W can be shortened because the striking surface 100s of the mixed fluid 100a contact the large area of the substrate W rotating at high speed.

In particular, a high vertical impact force is applied to foreign substances adhering to the substrate W by vertically spraying the mixed fluid 100a, discharged from the cleaning nozzle 100, onto the substrate W, thereby increasing the effect of separating the foreign substances from the substrate surface. Here, since the substrate W rotates at a high speed of 60 rpm to 600 rpm, the shear force generated by the linear speed of the substrate acts also on the foreign substances adhered to the substrate. Thereby, the secondary rebound phenomenon wherein the mixed fluid 100a vertically striking the substrate W is bounced back to the periphery is minimized. Accordingly, secondary contamination of the edge area of the substrate W by the guard pins can be prevented while minimizing contamination of the guard pins holding the substrate W.

Meanwhile, according to another embodiment of the present disclosure, the mixed fluid 100a discharged from the cleaning nozzle 100 may be inclined to face the rotation direction (10r) to apply a higher shear force 99 to foreign substances on the surface of the substrate. Here, according to an embodiment of the present disclosure, the angle between the substrate W and the flowing path until the mixed fluid 100a strikes the substrate W may be adjusted to 60 degrees or less. According to a preferred embodiment of the present disclosure, the angle between the substrate W and the flowing path until the mixed fluid 100a strikes the substrate W may be adjusted to 70 to 80 degrees to keep the vertical force striking the substrate W high, thereby increase the cleaning effect of the substrate.

Figure 9:
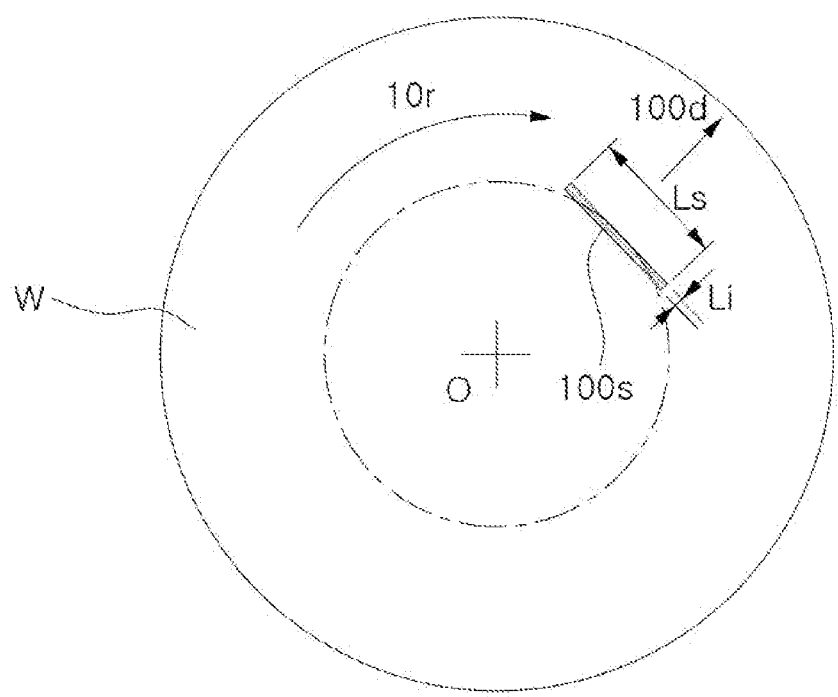
FIG. 9 is a plan view illustrating a striking position and moving direction of a mixed fluid sprayed onto a substrate by the substrate processing apparatus of FIG. 2 as another embodiment of the present disclosure.

Meanwhile, according to another embodiment of the present disclosure shown in FIG. 9, the long side Ls of the striking surface 100s of the mixed fluid 100a discharged from the discharge port 101 of the cleaning nozzle 100 and configured to strike the substrate W may be arranged to follow the circumferential direction of the substrate. In addition, the nozzle controller M may be controlled to sweep foreign substances on the substrate W to the outside of the substrate W while controlling the striking surface 100s of the mixed fluid 100a to move in a radially outward direction (100d) of the substrate W. Here, the support 10 may rotate (10r) the substrate, but may not rotate (10r) the substrate. Thereby, the slit-shaped mixed fluid discharged from the cleaning nozzle 100 and configured to strike the substrate W sweeps and discharges foreign substances remaining on the substrate W to the outside of the substrate W, thereby removing foreign substances from the substrate W within a short period of time. In addition, the surface of the substrate W can be cleaned even when the substrate W is not rotated (10r) by the support 10 regardless of the shape of the substrate W.

As such, foreign substances on the substrate W are removed by spraying the mixed fluid 100a, in which liquid and gas are mixed, sprayed in a slit shape through the slit-shaped discharge port 101 onto the surface of the substrate and by sweeping the foreign substances outside while moving the striking position of the mixed fluid toward the outside of the substrate in a state of being spraying obliquely toward the outside of the substrate. By performing the above process as a preliminary cleaning process prior to the main cleaning process including brush cleaning, it is possible to sweep and remove foreign substances before adhering to the polishing surface of the substrate, so that the cleaning efficiency in the cleaning process including brush cleaning can be further improved.

According to the present disclosure as described above, a mixed fluid sprayed from a cleaning nozzle strikes a substrate in a slit shape so that no shade is generated and, accordingly, an advantageous effect of increasing cleaning efficiency can be obtained.

That is, since a striking surface, which strikes a substrate, of a mixed fluid discharged from a slit-shaped discharge port of the cleaning nozzle is formed in a slit shape and the mixed fluid strikes a substrate at a predetermined stationary position without control of the movement of the cleaning nozzle, the high striking force in a vertical direction and the shear force due to the rotation of the substrate act together on foreign substances attached to the surface of the substrate, so that the effect of cleaning the substrate can be obtained within a short time without complicated position control of the cleaning nozzle.

Most of all, as the long side of the slit-shaped striking surface, which strikes a substrate, of the mixed fluid sprayed from the cleaning nozzle is arranged in the radial direction of the substrate, the cleaning process of the substrate can be completed in a short time by striking the wide surface of the disk-shaped substrate rotating at high speed with high striking force.

Here, the mixed fluid discharged from the cleaning nozzle is discharged obliquely to face the rotation direction to apply a high striking force to foreign substances on the surface of the substrate, so that the cleaning effect of removing foreign substances from the surface of the substrate can be improved.

Meanwhile, as the long side of the mixed fluid sprayed from the cleaning nozzle is arranged in a circumferential direction and the striking surface is moved in a radially outward direction, foreign substances remaining on the substrate surface are swept outward in a sweep method immediately after the foreign substances remaining on the substrate are separated from the substrate surface by the striking force of the mixed fluid, so that the cleaning efficiency can be increased while shortening the cleaning time.

In particular, as liquid is supplied to a slit-shaped gas passage through a plurality of liquid passages arranged in a width direction, not through a single liquid passage, and mixed in the slit-shaped gas passage, gas and liquid are homogeneously mixed across the width direction of the mixed fluid, so that the cleaning efficiency can be uniformly maintained at the center and both ends of the slit-shaped mixed fluid that strikes the substrate, thereby increasing the cleaning reliability.

In addition, the liquid passages are formed to be inclined downward toward the gas passage and form a contained angle of 45 to 70 degrees with the gas passage, so that the generation of vortices and countercurrent at a position where liquid and gas meet can be simultaneously minimized, thereby minimizing flowing of liquid, which is supplied to be mixed with gas, downward along an inner wall of the cleaning nozzle and enabling to be distributed in gas.

Accordingly, the present disclosure enables the mixed fluid to be sprayed into a uniform spray particle size, thereby obtaining an advantageous effect of improving cleaning quality and increasing reliability.

In addition, by performing pre-cleaning in a non-contact sweeping method before a polishing surface of a substrate on which a polishing process has been performed is subjected to a contact cleaning process with a brush, foreign substances remaining during the polishing process are quickly swept away, so that cleaning efficiency can be improved.

Further, by cleaning the back surface of the substrate to be subjected to the polishing process to remove foreign substances remaining on the surface of the substrate, errors from occurring due to lifting by the foreign substances can be prevented.

While the present disclosure has been described referring to the preferred embodiments, those skilled in the art will appreciate that many modifications and changes can be made to the present disclosure without departing from the spirit and essential characteristics of the present disclosure.

| [Description of Symbols] | |
|---|---|
| 10: support | 100: cleaning nozzle |
| 110: first body | 111: gas inflow passage |
| 112: liquid inflow passage | 120: second body |
| 121: gas passage | 122: liquid passage |
| 130: third body | GC: gas chamber |
| LC: liquid chamber | |

What is claimed is:

1. A substrate processing apparatus, comprising:
a support for holding a disk-shaped substrate; and
a cleaning nozzle for spraying a mixed fluid, in which liquid and gas are mixed, to a surface of the substrate in a slit shape through a slit-shaped discharge port to remove foreign substances remaining on the substrate with the mixed fluid discharged from the discharge port,
wherein the cleaning nozzle includes:
a first body having a gas inflow passage where the gas is supplied and passes. and a liquid inflow passage where the liquid is supplied and passes; and
a second body having a gas passage configured to communicate with the gas inflow passage and provided with a slit-shaped through hole formed to pass therethrough in a straight line shape, and liquid passages configured to communicate with the liquid inflow passage and extended inclinedly toward the discharge port to meet the gas passage, wherein a slit-shape hole is formed at a position extending downward from a position where the gas passage and the liquid passages meet, and wherein the second body is coupled to the first body,
wherein between the liquid passages and the liquid inflow passage, a liquid chamber filled with the liquid is formed in an annular shape surrounding the second body.

2. The substrate processing apparatus according to claim 1, wherein cleaning the substrate with the cleaning nozzle is a pretreatment cleaning process performed before a substrate polishing process and is performed on a rear surface of the substrate to remove foreign substances remaining on the rear surface of the substrate.

3. The substrate processing apparatus according to claim 1, wherein cleaning the substrate with the cleaning nozzle is a preliminary cleaning process performed before a brush cleaning process immediately after a substrate polishing process is performed and is performed on a polishing surface of the substrate to remove foreign substances remaining on the polishing surface of the substrate.

4. The substrate processing apparatus according to claim 1, wherein the discharge port is formed in a slit shape to discharge the mixed fluid to the substrate with a high pressure higher than atmospheric pressure.

5. The substrate processing apparatus according to claim 4, wherein the substrate rotates together with the support; and
a long side of a striking surface of the mixed fluid discharged from the discharge port and configured to strike the substrate is arranged along a radial direction of the substrate.

6. The substrate processing apparatus according to claim 5, wherein the cleaning nozzle is maintained in a fixed position.

7. The substrate processing apparatus according to claim 6, wherein the cleaning nozzle sprays the mixed fluid perpendicularly to the substrate.

8. The substrate processing apparatus according to claim 6, wherein the cleaning nozzle sprays the mixed fluid obliquely toward the substrate while facing a rotation direction of the substrate.

9. The substrate processing apparatus according to claim 4, wherein a long side of a striking surface of the mixed fluid discharged from the discharge port to strike the substrate is arranged along a circumferential direction of the substrate, and foreign substances on the substrate are swept and removed out of the substrate while the striking surface moves in a radially outward direction of the substrate.

10. The substrate processing apparatus according to claim 1, wherein the liquid passages are formed in a straight line shape.

11. The substrate processing apparatus according to claim 10, wherein an acute angle formed by the liquid passage and the gas passage is 45 degrees to 70 degrees.

12. The substrate processing apparatus according to claim 1, wherein the liquid passages are formed of a plurality of rows separated from each other in a width direction of the slit.

13. The substrate processing apparatus according to claim 1, wherein the liquid passages in the second body are symmetrical with respect to the gas passage, and outlets of the liquid passages are formed at a same position.

14. The substrate processing apparatus according to claim 12, wherein, in inlets of the liquid passages, a support surface perpendicular to an extension direction of the liquid passage is formed on an outer surface of the second body.

15. The substrate processing apparatus according to claim 14, wherein the support surface is provided on a concave portion formed sharply from an outer surface of the second body, and the concave portion is formed by the support surface and a guide surface erected perpendicularly to the support surface.

16. The substrate processing apparatus according to claim 1, wherein a gas chamber communicating with the gas passage is formed between the first body and the second body.

17. The substrate processing apparatus according to claim 1, wherein in the gas passage of the second body, a second width $w2$ at a position where the liquid passages are placed is larger than a first width $w1$ on an upper side of outlets of the liquid passages, and a constant cross-section having the second width $w2$ extends downward to a lower side of the liquid passages.

18. The substrate processing apparatus according to claim 1, wherein the cleaning nozzle comprises a slit-shaped mixing passage connected to a lower end of the gas passage, a lower end of the mixing passage forming the discharge port of the cleaning nozzle, and the cleaning nozzle further comprising a third body connected to the second body,
  wherein the mixing passage is formed to be longer than a length of the gas passage and has a same cross-section as the gas passage.

19. The substrate processing apparatus according to claim 4, further comprising a nozzle controller for adjusting at least one of a position and angle of the mixed fluid discharged from the cleaning nozzle.

* * * * *